United States Patent [19]

Takao

[11] Patent Number: 4,819,079

[45] Date of Patent: Apr. 4, 1989

[54] DATA PROCESSING APPARATUS

[75] Inventor: Mitsuji Takao, Tokyo, Japan

[73] Assignee: Canon Kabushiki Kaisha, Tokyo, Japan

[21] Appl. No.: 577,992

[22] Filed: Feb. 8, 1984

[30] Foreign Application Priority Data

Feb. 14, 1983 [JP] Japan ................................. 58-23472

[51] Int. Cl.[4] ............................................... H04N 1/00
[52] U.S. Cl. .................................... 358/260; 358/280; 341/67
[58] Field of Search ......................... 358/261, 260, 280; 340/347 DD

[56] References Cited

U.S. PATENT DOCUMENTS 4,376,933  3/1983  Saran et al. ........................... 358/261
4,533,956  8/1981  Fedde .................................... 358/260

FOREIGN PATENT DOCUMENTS 98153    1/1984  European Pat. Off. .
2940487  of 0000 Fed. Rep. of Germany .
2000663  1/1979  United Kingdom .

OTHER PUBLICATIONS

IBM Technical Disclosure Bulletin, vol. 19, No. 5, pp. 1892–1895 (Oct. 1976).

IBM Technical Disclosure Bulletin, vol. 23, No. 3, pp. 1211–1216 (Aug. 1980).

Primary Examiner—Edward L. Coles, Sr.
Attorney, Agent, or Firm—Fitzpatrick, Cella, Harper & Scinto

[57] ABSTRACT

An apparatus for data compression, in which a code of variable code length, for example modified Huffman code, is converted into a code of constant length through a memory stores code data obtained by conversion of input image data in a memory device on a parallel basis. The storage of the code data is controlled to cause the memory device to store each set or group of code data immediately following the code data which have already been stored there, to permit continuous code data storage without a break and thus at high speed. The code data may first be stored in a separate memory device, in sets of variable length. Code data may, for example, be formed continuously from image data released in accordance with a first clock signal, the continuous data being formed in accordance with a second clock signal the frequency of which is higher than that of the first. In another aspect, image data obtained by reading a document image are sequentially encoded into code data, which are then taken into a register device which can shift a plurality of bits upon application of a single clock pulse.

25 Claims, 4 Drawing Sheets

FIG. 3A

| MPX P34 (SLB=8−Y) | SLB | REG B INPUT | | | | | | | | | | | |
|---|---|---|---|---|---|---|---|---|---|---|---|---|---|
| | | $a_0$ | $a_1$ | $a_2$ | $a_3$ | $a_4$ | $a_5$ | $a_6$ | $a_7$ | $a_8$ | $a_9$ | $a_{10}$ | $a_{11}$ |
| | 0 | $b_8$ | $b_9$ | $b_{10}$ | $b_{11}$ | $b_{12}$ | × | × | × | × | × | × | × |
| | 1 | $b_1$ | $b_2$ | $b_3$ | $b_4$ | $b_5$ | $b_6$ | $b_7$ | $b_8$ | $b_9$ | $b_{10}$ | $b_{11}$ | $b_{12}$ |
| | 2 | $b_2$ | $b_3$ | $b_4$ | $b_5$ | $b_6$ | $b_7$ | $b_8$ | $b_9$ | $b_{10}$ | $b_{11}$ | $b_{12}$ | × |
| | 3 | $b_3$ | $b_4$ | $b_5$ | $b_6$ | $b_7$ | $b_8$ | $b_9$ | $b_{10}$ | $b_{11}$ | $b_{12}$ | × | × |
| | 4 | $b_4$ | $b_5$ | $b_6$ | $b_7$ | $b_8$ | $b_9$ | $b_{10}$ | $b_{11}$ | $b_{12}$ | × | × | × |
| | 5 | $b_5$ | $b_6$ | $b_7$ | $b_8$ | $b_9$ | $b_{10}$ | $b_{11}$ | $b_{12}$ | × | × | × | × |
| | 6 | $b_6$ | $b_7$ | $b_8$ | $b_9$ | $b_{10}$ | $b_{11}$ | $b_{12}$ | × | × | × | × | × |
| | 7 | $b_7$ | $b_8$ | $b_9$ | $b_{10}$ | $b_{11}$ | $b_{12}$ | × | × | × | × | × | × |

FIG. 3B

| MPX Q35 (SLC=Y) | SLC | REG C INPUT | | | | | | | |
|---|---|---|---|---|---|---|---|---|---|
| | | $c_0$ | $c_1$ | $c_2$ | $c_3$ | $c_4$ | $c_5$ | $c_6$ | $c_7$ |
| | 0 | $b_0$ | $b_1$ | $b_2$ | $b_3$ | $b_4$ | $b_5$ | $b_6$ | $b_7$ |
| | 1 | $c_0$ | $b_0$ | $b_1$ | $b_2$ | $b_3$ | $b_4$ | $b_5$ | $b_6$ |
| | 2 | $c_0$ | $c_1$ | $b_0$ | $b_1$ | $b_2$ | $b_3$ | $b_4$ | $b_5$ |
| | 3 | $c_0$ | $c_1$ | $c_2$ | $b_0$ | $b_1$ | $b_2$ | $b_3$ | $b_4$ |
| | 4 | $c_0$ | $c_1$ | $c_2$ | $c_3$ | $b_0$ | $b_1$ | $b_2$ | $b_3$ |
| | 5 | $c_0$ | $c_1$ | $c_2$ | $c_3$ | $c_4$ | $b_0$ | $b_1$ | $b_2$ |
| | 6 | $c_0$ | $c_1$ | $c_2$ | $c_3$ | $c_4$ | $c_5$ | $b_0$ | $b_1$ |
| | 7 | $c_0$ | $c_1$ | $c_2$ | $c_3$ | $c_4$ | $c_5$ | $c_6$ | $b_0$ |

DATA PROCESSING APPARATUS

BACKGROUND OF THE INVENTION

1. Field of the Invention

The present invention relates to a data compression apparatus adapted for use in an electronic image file or the like, and more particularly to such apparatus for forming compressed data by applying a compression process of a determined logic to input data.

2. Description of the Prior Art

There is already known a technology for compressing binary digital data of high redundancy, such as digital image signals read from an object, according to a determined logic. Such compression technology is used for reducing the quantity of data and shortening the transmission time, for example in so-called facsimile apparatus for image transmission through a telephone line.

Also there are have recently been proposed electronic image files utilizing laser disks or magnetic disks capable of storing a large quantity of image data, and the use of such compression technology in such apparatus allows one to effectively increase the memory capacity of these memory media.

Among such data compression processes is particularly well known the modified Huffman process (M-H process), in which the original image data are converted into modified Huffman codes (M-H codes) according to the measurement of consecutive number of white or black signals in the original image data, or of so-called run length.

Said M-H codes have variable code length ranging from 2 bits to 13 bits according to the run length. Consequently it is not easy to pack such M-H codes into the units of combined bytes or of words.

In the aforementioned facsimile apparatus in which the scanning for reading the original image need not be of a very high speed and the mechanical operation for original scanning can be conducted intermittently, the connection of M-H codes has conventionally been conducted at a low speed for example with a microcomputer and the scanning of a succeeding line is started at the time of the signal packing or transmission of a preceding line.

However high-speed processing and transmission of data have come to be desired recently for the electronic image file and the like, and such demands require high-speed original reading and M-H data processing on real-time basis. Conventional data processing methods have however not been able to completely satisfy such demands, thus being a bottleneck in achieving high-speed processing in the apparatus.

SUMMARY OF THE INVENTION

In consideration of the foregoing, an object of the present invention is to provide a data processing apparatus capable of high-speed data processing and transmission meeting the requirements of electronic image files and the like.

Another object of the present invention is to provide a data processing apparatus capable of forming data of a determined effective length by processing data of variable data length.

Still another object of the present invention is to provide a data processing apparatus capable of data compression on realtime basis.

Still another object of the present invention is to provide a data processing apparatus capable of pipeline processing of data read from an object.

Still another object of the present invention is to provide a data processing apparatus enabling high-speed continuous original reading regardless of the status of the proceessing operation of compressed data.

The foregoing and still other objects of the present invention, and the advantages thereof, will become fully apparent from the following description.

BRIEF DESCRIPTION OF THE DRAWINGS

FIGS. 3A and 3B are charts showing the relation between input and output data.

DETAILED DESCRIPTION OF THE PREFERRED EMBODIMENTS

Now the present invention will be explained in greater detail by an embodiment thereof shown in the attached drawings.

Figure 1:
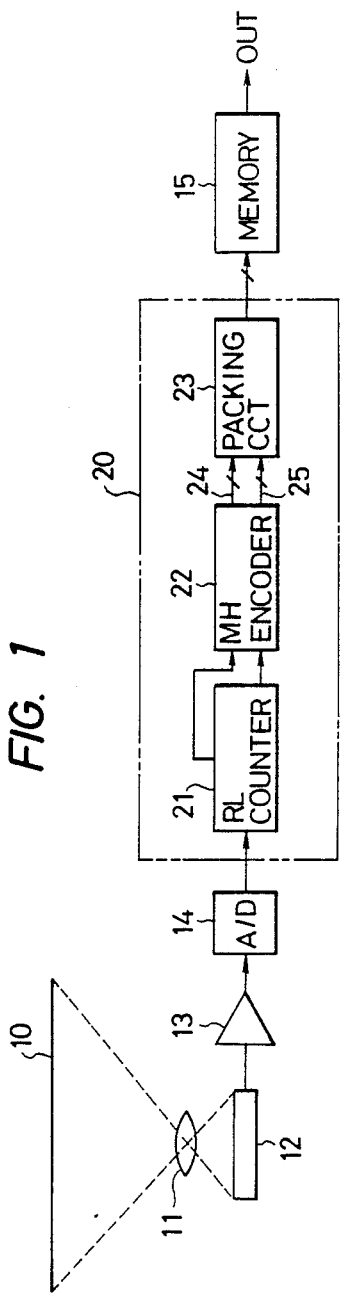
FIG. 1 is a schematic block diagram of an embodiment of the present invention applied to an original reading apparatus.

FIG. 1 shows an embodiment of the present invention applied to an original image reading apparatus for use in an electronic image file, wherein an original document 10 is illuminated by an unrepresented light source and the reflected light is focused by a lens 11 onto an image sensor 12 composed of a charge-coupled device. The image sensor 12 comprises an array of plural photoelectric converting elements arranged in the cross direction of the original, and release serial electric signals according to the quantity of incident light for each scanning line. The image sensor 12 and the original 10 are relatively moved at a determined speed and in a continuous manner, in a direction substantially perpendicular to the scanning direction, by means of an unrepresented driving mechanism. In this manner the image sensor 12 photoelectrically reads the entire area of the original 10 to form electric signals corresponding to the image density on the original 12.

The output signals of the image sensor 12 are amplified in an amplifier 13 and the converted, in an A/D converter 14, into binary image signals representing white and black levels, according to a suitable sampling frequency. Said binary signals from the A/D converter 14 are supplied to a data compression circuit 20, which counts, by means of a run length counter 21, the numbers of consecutive white and black signals, respectively. An M-H encoder 22, receiving said counts and a signal indicating white or black level, supplies a packing circuit 23 with an M-H code 25 and a signal 24 indicating the code length of said M-H code. Said packing circuit 23 forms and successively releases data of a determined effective length, for example 8 bits, by combining M-H codes 25 of variable length utilizing the code length signal 24. The data released in succession from the data compression circuit 20 are transmitted, through a buffer memory 15, in the form of serial continuous output signals, which are used for storage in a data file such as an optical disk or the transmission to a distant location through a telephone line. In this manner it is rendered possible to store data at a high speed in a disk of a small capacity or to reduce the time for transmission.

Figure 2A:
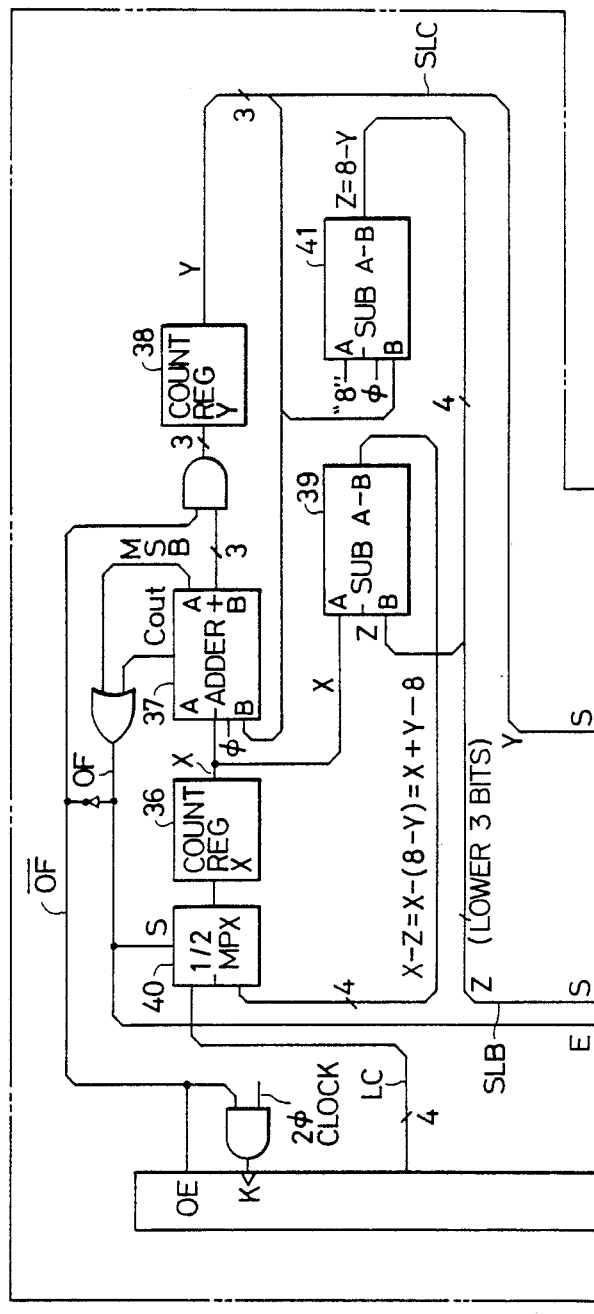
FIG. 2 composed of FIGS. 2A and 2B is a circuit diagram showing a detailed example of the data compression circuit 20 shown in FIG. 1.
Figure 2B:
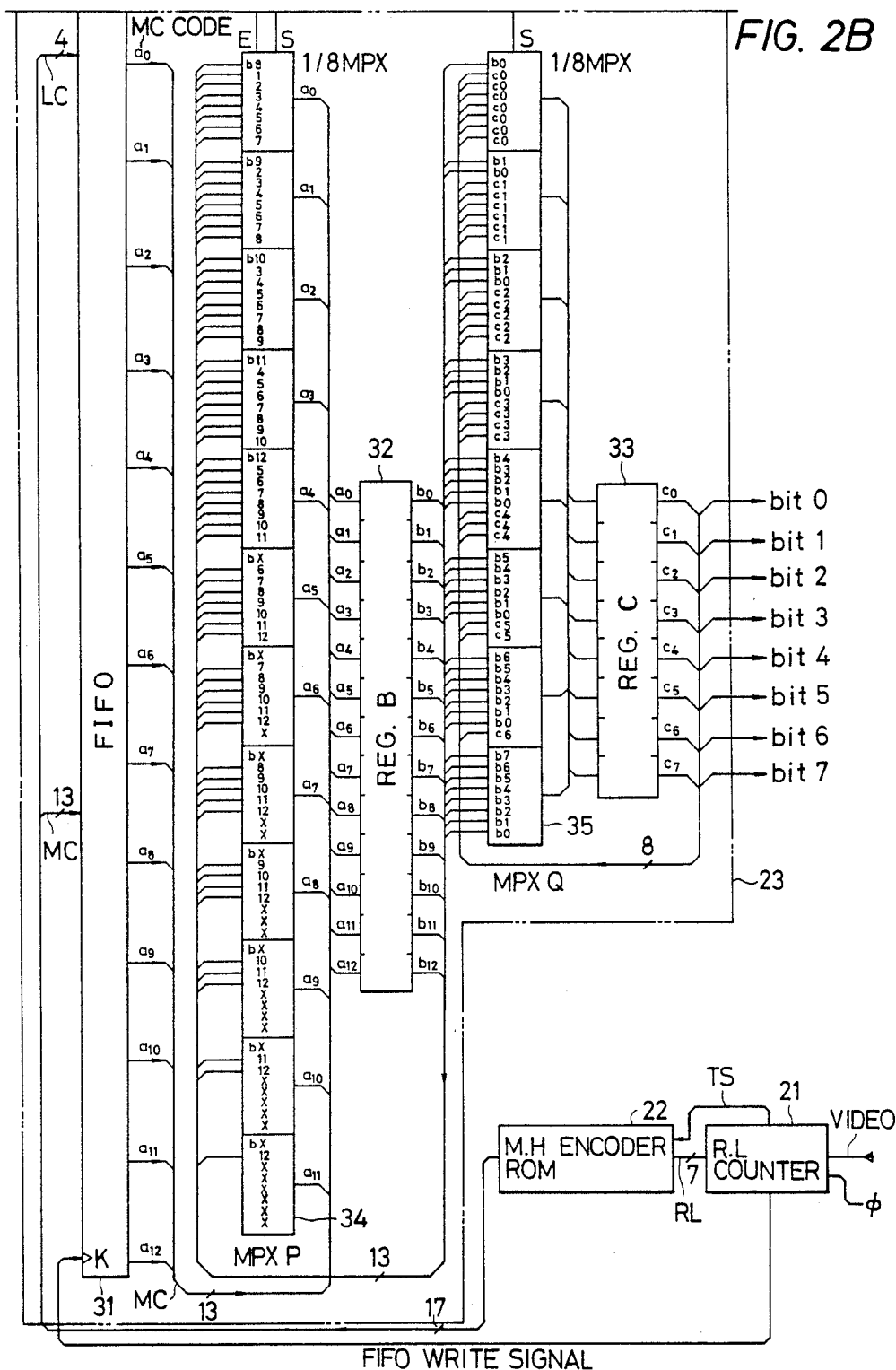

FIG. 2 shows an example of the data compression circuit shown in FIG. 1, which is adapted for converting the serial original image data into modified Huffman codes of variable code length, and packing said codes into data of a determined effective length of one byte for supply to an electronic image file or the like.

Binary digital data VIDEO obtained by reading an original and indicating the image density thereof are supplied to a run-length (R-L) counter 21 for determining the run lengths, or numbers of consecutive white and black signals. At the same time there is discriminated whether the input signals under run-length counting indicate white or black level. A thus obtained run length signal RL and a signal TS indicating the white or black level are supplied to address lines of an M-H encoder 22 composed of a read-only memory storing a modified Huffman converting table. The M-H encoder 22 converts said data RL and signal TS into M-H codes of 13 bits at maximum and generates a 4-bit signal indicating the effective code length thereof, both in parallel manner. As an example, for an M-H code "0011", the M-H converting table generates an M-H code MC "0011XXXXXXXXX" (X being arbitrary) and a code-length signal LC "0100" (4).

The M-H codes MC and effective code length signals LC generated in the above-described manner are supplied in parallel to the packing circuit 23 and stored in a first-in-first-out (FIFO) buffer memory 31.

The above-described operations of the run-length counter 21, M-H encoder 22 and FIFO buffer memory 31 are conducted on a real-time basis in synchronization with the transfer clock signals $\phi$ for the original image data VIDEO, for example simultaneously with the image reading operation of a constant speed.

Subsequently the M-H codes MC and the effective code length signals LC are read from the FIFO buffer memory 31 for bit handling for combining the M-H codes. The speed of the signal reading from the FIFO buffer memory 31 and of the bit handling is selected to be equal to or higher than twice the transfer rate of the original image data, and is selected in the present embodiment to be twice that rate, in consideration of an increase in the data quantity in the M-H conversion. An excessively high speed is however not required, since the data supply may become unable to follow the data processing.

The M-H code MC of 13 parallel bits at maximum taken out from the FIFO buffer memory 31 is transferred in succession from a register B (32) of 13 bits to a register C (33) of 8 bits and is thus packed finally to 1 byte or 8 bits. Said M-H code MC has to be subjected to a bit combining process because it has a variable code length corresponding to the run length. Said bit combining process is conducted in a ⅝ multiplexer P (MPXP) 34 and another ⅝ multiplexer Q (MPXQ) 35. In FIG. 2, symbols "X" in the input ports of the multiplexer P (34) indicate unused ports.

The multiplexer Q (35) is used for packing, into the lower bits of an M-H code MC stored in the register C (33), the upper bits of a succeeding M-H code MC stored in the register B (32).

The multiplexer P (34) is used for shifting the signals in the register B (32) toward the upper bits corresponding to the number of bits transferred from said register B (32) to the register C (33), and then transferring said signals to said register C (32).

The effective code length signals LC are supplied, through a multiplexer 40, to a count register X (36), and cumulatively added by an adding circuit 38 and a count register Y (38). The result of said addition indicates the number of bits stored in the register C (33).

A signal SLC indicating the content of the counter register Y (38) instructs, to the multiplexer Q (35), the lower bit positions in the register C (33) where the data are to be transferred from the register B (32).

Since the register C (33) has a limited capacity, which is 8 bits in the present embodiment, the data bits stored in the register B (32) may not be entirely transferred. In such case the overflow, or the remaining bits, remain in the register B (32). The number of such remaining bits is calculated in a subtracting circuit 39 receiving the content of the count register X (36) and the content of a subtracting circuit 41, and is set again in the count register X (36) through a multiplexer 40 which is selectively activated by an overflow signal OF generated by the adding circuit 37 in response to a carry-out or the most significant bit. In this manner there is reached a state the same as when data are set anew from the FIFO buffer memory 31 to the register B (32).

Also in such case, the remaining data bits in the register B (32) have to be shifted toward the upper bit end by the number of bits transferred to the register C (33). Said number of bits transferred to the register C (33) is calculated by the subtracting circuit 41 receiving the number of effective bits (8 bits) and the content of the count register Y (38), and the result of subtraction is supplied as a selecting signal SLB to operate the multiplexer P (34) which is enabled by the overflow signal OF, thereby shifting the remaining data bits in the register B (32) toward the upper bits.

The multiplexer P (34) is enabled only during the overflow of the register C (33). Consequently during the absence of said overflow, the code data MC are merely transferred from the FIFO buffer memory 31 to the register B (32), then shifted by the multiplexer Q (35) and transferred to the register C (33).

In response to an overflow of the register C (33), the readout of the code data from the FIFO buffer memory 31 is interrupted by an inverted signal $\overline{OF}$ of the overflow signal OF but the bit combining operation continues. Thus some of the data bits in the register B (32) are packed into the lower bit positions of the register C (33) while the remaining bits in the register B (32) are shifted upwards by the multiplexer P (34), whereby the register C (33) is completely filled with data of one byte. The cumulatively added value in the count register Y (38) is cleared by the overflow signal OF, since the register C (33) starts, after overflowing, data storage anew from the empty state.

The FIFO buffer memory 31 releases a signal indicating "empty" buffer, when the bit combining operation overtakes the supply of image data. In such case the bit combining operation is temporarily interrupted.

Figure 4:
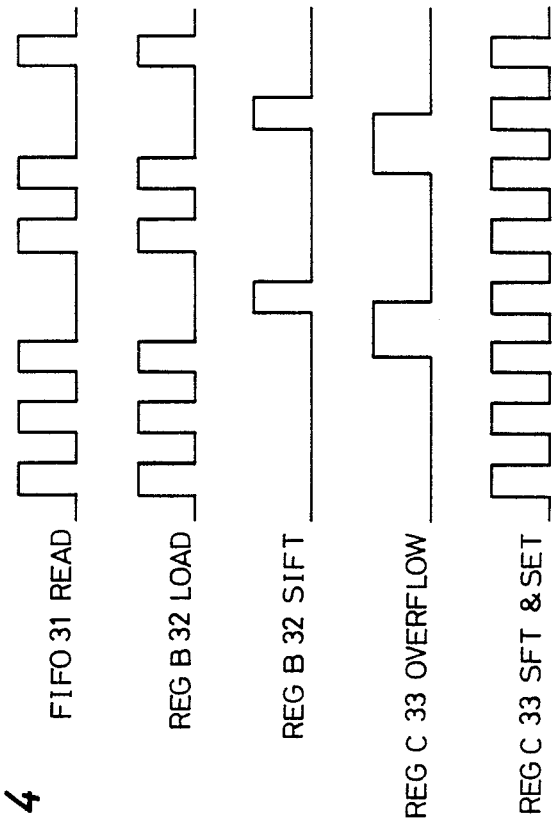
FIG. 4 is a timing chart showing the function of the circuit shown in FIG. 2.

FIG. 3A shows the relation of the input and output signals of the multiplexer P (34) and register B (32), while FIG. 3B shows that of the multiplexer Q (35) and register C (33). Also FIG. 4 shows a timing chart of the function of the FIFO buffer memory 31, register B (32) and register C (33).

As shown in these figures, code data stored in the FIFO buffer memory 31 are subjected, in successive manner, to the data packing into the register C (33) and to the data shifting and receiving in the register B (32), said data shifting being naturally omitted in the absence of remaining bits in said register B (32). The use of a doubled speed 2φ for said packing and shifting operation, in comparison with the transfer rate φ of the original image data, enables high-speed real-time processing avoiding intermittent original reading and sufficiently coping with the data expansion in the M-H conversion.

As explained in the foregoing, the M-H codes of variable length released in succession from the M-H encoder 22 are supplied to the FIFO buffer memory 31, and are handled as parallel data in the following data processing to reduce the time required in the bit combining. It is therefore rendered possible to compress the input signal without restricting the image reading operation corresponding to the signal processing speed. Therefore, the original image reading operation need not be conducted in an intermittent manner but can be conducted at a high speed and in a continuous manner.

In the foregoing embodiment the data of M-H codes are packed into a unit of one byte, but said packing may be conducted in a unit of one word or several bytes according to the specification of an ensuing apparatus such as the electronic image file or of data transmission. In such case the multiplexers have to be suitably modified according to the unit of said packing, but the bit packing process by the multiplexer Q (35) and the shifting process by the multiplexer P (34) can be achieved in a similar structure.

Also the data processing speed may be selected higher than twice of the data transfer rate.

The data subjected to said packing are not limited to the M-H codes obtained from the image data but include other data of variable data length obtainable from various data output apparatus, such as data compressed by other compression logics or data read from semiconductor or magnetic memories and converted according to a determined logic.

As explained in the foregoing, the present invention achieves high-speed data processing by converting serial input data into parallel data of variable length and processing such parallel data in parallel manner, thereby preventing excessive increase in the processing frequency and enabling real-time processing of the input signals.

Also the aforementioned structure of the processing circuit for the M-H codes released from the M-H encoder 22 avoids the necessity of intermission in the signal reading or encoding, for awaiting the completion of signal packing or transmission for the preceding line. The original reading and signal compression can be conducted in continuous manner and simultaneously with the following data packing process. Thus the signals of a succeeding line can be read and compressed without awaiting the completion of the signal processing for the preceding line.

What I claim is:

1. A data processing apparatus, comprising:
   means for sequentially generating variable length code data;
   first memory means adapted to store a maximum length of code data for storing the code data generated from said generating means, and for outputting in parallel the code data therefrom;
   second memory means for taking in in parallel the code data output in parallel from said first memory means and storing those code data, and for releasing a predetermined length of code data; and
   control means for controlling storage locations of the code data output in parallel from first memory means in said second memory means.

2. A data processing apparatus according to claim 1, wherein said generating means is adapted to form code data representing redundancy of binary signals.

3. A data processing apparatus according to claim 1, wherein said control means comprises selecting means for selecting code data stored in said first memory means and transmitting said selected code data to said second memory means.

4. A data processing apparatus according to claim 1, wherein said control means comprises means for shifting the code data stored in said first memory means in accordance with length of the code data.

5. A data processing apparatus according to claim 1, wherein said generating means is adapted to release code data in parallel manner, and said first memory means is adapted to receive said parallel data and to release the same in parallel manner.

6. A data processing apparatus according to claim 1, wherein said control means is adapted to perform control operation in accordance with the data length of the code data generated from said generating means.

7. An image data processing apparatus, comprising:
   means for photo-electrically reading a document image to release bit serial image data in accordance with a first clock signal;
   means for encoding sequentially the serial image data into code data; and
   means for forming continuous data, in accordance with a second clock signal, by means of coupling together the plural code data output sequentially from said encoding means,
   wherein a frequency of said second clock signal associated with the continuous data formation is higher than that of said first clock signal associated with the image data releasing.

8. An image data processing apparatus according to claim 7, wherein said encoding means is adapted to compress the image data in accordance with a predetermined logic.

9. An image data processing apparatus according claim 8, wherein said forming means includes memory means for taking in in parallel the code data from said encoding means and storing said code data therein, said memory means being operable in accordance with said second clock signal.

10. An image data processing apparatus according to claim 7, wherein said second clock signal has a frequency twice that of said first clock signal.

11. An image data processing apparatus according to claim 8 or 9, wherein said forming means is adapted to perform the continuous data forming operation, without interruption of the reading operation of said reading means.

12. An image data processing apparatus according to claim 7, wherein said code data are variable length data.

13. An image data processing apparatus according to claim 7, wherein said reading means is operable to read the document image on a continuous basis, but not on an intermittent basis.

14. An image data processing apparatus comprising:
   means for inputting bit serial image data, said inputting means comprising reading means for reading a document image on a continuous basis, but not an intermittent basis, to generate the image data;

conversion means for sequentially converting input image data into a variable data length of code data, and for outputting the code data in parallel;

memory means for taking in parallel the code data output in parallel from said conversion means, and for storing said code data therein; and control means for controlling storage of the code data from said conversion means into said memory means so as to cause said memory means to store therein the successive code data following the code data which have been already stored therein.

15. An image data processing apparatus according to claim 14, wherein said control means controls storage of the code data into said memory means in accordance with length of the code data.

16. An image data processing apparatus according to claim 14, wherein said conversion means is adapted to compress the input image data in accordance with a predetermined logic.

17. An image data processing apparatus according to claim 14, wherein said input image data applied to said conversion means are binary signals representing density of an image.

18. An image data processing apparatus according to claim 14, wherein said control means controls the memory locations of the code data in said memory.

19. An image data processing apparatus according to claim 14, wherein said memory means is adapted to store a predetermined length of data.

20. An image data processing apparatus according to claim 14, wherein said memory means is operable in accordance with a clock signal a frequency of which is higher than that of a clock signal synchronized with entering of the image data into said conversion means.

21. An image data processing apparatus comprising:

means for photo-electrically reading a document image on a continuous basis, but not on an intermittent basis, to release image data;

means for encoding sequentially the released image data into code data;

register means adapted to take in the code data output from said encoding means and for outputting the code data in parallel; and storage means for storing the code data output in parallel from said register means, wherein said register means is operable to shift a plurality of bits of code data upon application of one clock so as to cause said storage means to store therein the successive code data following the code data which have already been stored therein.

22. An image data processing apparatus according to claim 21, wherein said encoding means is adapted to compress the image data in accordance with a predetermined logic.

23. An image data processing apparatus according to claim 21, wherein said register means is operable to shift the code data in accordance with length of the code data.

24. An image data processing apparatus according to claim 21, wherein said register means is operable to take in in parallel the code data output from said encoding means.

25. An image data processing apparatus according to claim 21, wherein said code data are variable length data.

* * * * *

UNITED STATES PATENT AND TRADEMARK OFFICE
CERTIFICATE OF CORRECTION

PATENT NO. : 4,819,079
DATED : April 4, 1989
INVENTOR(S) : MITSUJI TAKAO

Page 1 of 2

It is certified that error appears in the above-identified patent and that said Letters Patent is hereby corrected as shown below:

IN [56] REFERENCES CITED

U.S. PATENT DOCUMENTS, "4,533,956  8/1981  Fedde" should read --4,533,956  8/1985  Fedde--.

SHEET 1

FIG. 4, "REG B 32 SIFT" should read --REG B32 SHIFT--.

COLUMN 1

Line 19, "are" should be deleted.
Line 35, "the" should be deleted.
Line 46, "However" should read --However,--.
Line 68, "realtime" should read --real-time--.

COLUMN 2

Line 48, "the" should read --then--.

COLUMN 3

Line 68, "register C(32)." should read --register C(33).--.

COLUMN 4

Line 6, "counter" should read --count--.
Line 20, "or" should read --of--.

UNITED STATES PATENT AND TRADEMARK OFFICE
CERTIFICATE OF CORRECTION

PATENT NO. : 4,819,079
DATED : April 4, 1989
INVENTOR(S) : MITSUJI TAKAO

Page 2 of 2

It is certified that error appears in the above-identified patent and that said Letters Patent is hereby corrected as shown below:

COLUMN 5

Line 30, "of" should be deleted.

COLUMN 6

Line 44, "claim 8," should read --claim 7,--.
Line 54, "claim 8 or 9," should read --claim 7 or 9,--.

COLUMN 7

Line 4, "taking in" should read --taking in in--.

Signed and Sealed this

Thirteenth Day of March, 1990

*Attest:*

JEFFREY M. SAMUELS

*Attesting Officer*   Acting Commissioner of Patents and Trademarks